United States Patent

Nakagawa et al.

Patent Number: 5,896,874
Date of Patent: Apr. 27, 1999

[54] APPARATUS FOR CONTROLLING RESIST STRIPPING SOLUTION

[75] Inventors: Toshimoto Nakagawa, Kawasaki; Kouzo Tsukada, Yokohama; Shu Ogawa, Nagareyama; Takahiro Houzan, Tatsuno; Yoshitaka Nishijima, Hyogo, all of Japan

[73] Assignees: Hirama Rika Kenkyujo Ltd., Kanagawa; Nagase & Co., Ltd., Osaka, both of Japan

[21] Appl. No.: 08/810,816

[22] Filed: Mar. 6, 1997

[30] Foreign Application Priority Data

Jul. 2, 1996 [JP] Japan ................. 8-193005

[51] Int. Cl.[6] ................................. B08B 3/04
[52] U.S. Cl. ............... 134/56 R; 134/58 R; 134/95.3; 134/99.1
[58] Field of Search ................. 134/56 R, 57 R, 134/58 R, 113, 95.1, 95.3, 98.1, 100.1, 111, 902

[56] References Cited

U.S. PATENT DOCUMENTS

| | | | |
|---|---|---|---|
| 3,880,685 | 4/1975 | Rehm et al. | 134/902 |
| 3,964,956 | 6/1976 | Snyder | 134/902 |
| 4,190,481 | 2/1980 | Gofferdo | 134/902 |
| 5,223,881 | 6/1993 | Nakagawa et al. | 396/627 |
| 5,246,023 | 9/1993 | Breunsbach et al. | 134/902 |
| 5,275,184 | 1/1994 | Nishizawa et al. | 134/902 |
| 5,671,760 | 9/1997 | Nakagawa et al. | 134/56 R |
| 5,722,441 | 3/1998 | Teramoto | 134/113 |
| 5,746,233 | 5/1998 | Kuroda et al. | 134/902 |

FOREIGN PATENT DOCUMENTS

| | | | |
|---|---|---|---|
| 61-281532 | 12/1986 | Japan | 134/902 |
| 63-314835 | 12/1988 | Japan | 134/902 |
| 3-237717 | 10/1991 | Japan | 134/902 |
| 4-42531 | 2/1992 | Japan | 134/902 |
| 4-134843 | 5/1992 | Japan | 134/902 |
| 4-188830 | 7/1992 | Japan | 134/902 |
| 4-278529 | 10/1992 | Japan | 134/902 |
| 5-3186 | 1/1993 | Japan | 134/902 |
| 5-74755 | 5/1993 | Japan | 134/902 |
| 5-144787 | 6/1993 | Japan | 134/902 |
| 5-234977 | 9/1993 | Japan | 134/902 |

*Primary Examiner*—Frankie L. Stinson
*Attorney, Agent, or Firm*—Jones, Tullar & Cooper, P.C.

[57] ABSTRACT

In a semiconductor manufacturing process or a liquid crystal board manufacturing process, a resist stripping solution blending an organic alkali and an organic solvent is used for stripping the resist completely from the board. An apparatus for controlling this resist stripping solution comprises a resist stripping solution discharge device for discharging the resist stripping solution by detecting the dissolved resist concentration in the resist stripping solution by using an absorption photometer, a source solution and water replenishing device for replenishing the resist stripping source solution and pure water by detecting the liquid level of the resist stripping solution by a liquid level gauge, and a source solution and/or water replenishing device for replenishing at least one of the resist stripping source solution pure water by detecting the water concentration of the resist stripping solution by using an another absorption photometer. As a result, in an apparatus for controlling a resist stripping solution used in resist stripping in a semiconductor manufacturing process or a liquid crystal board manufacturing process, the quality of the resist stripping solution is controlled constantly, the solution consumption is saved, the operation down time is reduced, and the cost is lowered.

4 Claims, 8 Drawing Sheets

NUMBER OF BOARDS PROCESSED

DISSOLVED RESIST
CONCENTRATION (g/l)

APPARATUS FOR CONTROLLING RESIST STRIPPING SOLUTION

BACKGROUND OF THE INVENTION

The present invention relates to an apparatus for controlling resist stripping solution used in stripping resist in a semiconductor manufacturing process, a liquid crystal board manufacturing process or the like, and more particularly to an apparatus combining a continuous automatic replenishing mechanism of resist stripping solution in cyclic use, a water concentration regulating mechanism, and a resist stripping solution automatic discharge mechanism for arresting deterioration of resist stripping performance due to enrichment of dissolved resist.

The resist material used for a photolithography in a semiconductor manufacturing process, a liquid crystal manufacturing process or the like, is divided into a positive type which has solubility by exposure and a negative type which has insolubility by exposure. The positive type resist is used mainly.

As a typical example of the positive type resist, a resist mainly comprises a naphthoquinone-diazido photosensitive agent and an alkali soluble resin (novolak resin).

At the final stage of a photolithography process, a process for completely removing the resist from the board must be installed.

Japanese Laid-Open Patent Publication No. 7-235487 discloses an apparatus for controlling a resist stripping solution comprising resist stripping solution discharge means for discharging resist stripping solution by detecting the dissolved resist concentration in the resist stripping solution by means of an absorption photometer, first replenishing means for replenishing organic solvent and alkanolamine, or a fresh resist stripping solution preliminaly blending organic solvent and alkanolamine by detecting the liquid level of the resist stripping solution by means of a liquid level gauge, and second replenishing means for replenishing at least one of organic solvent and alkanolamine by detecting the alkanolamine concentration of the resist stripping solution by means of an absorption photometer.

In the resist stripping process of a liquid crystal board, as mentioned above, a blending solution of organic alkali and organic solvent is mainly used as a resist stripping solution, and it is found that a superior effect is obtained by using a resist stripping solution further adding an appropriate amount of water.

That is, by employing a resist stripping solution containing an appropriate amount of water, the board processing temperature may be lowered to about 40° C. from about 80° C. in the case of a resist stripping solution not containing water, and therefore damage to the foundation metal for forming a board or a semiconductor circuit can be decreased. The resist stripping solution can be handled as nonflammable matter and safety is high, the evaporation loss is mainly water which is inexpensive, and the stripping speed is high.

For example, a solution of dimethyl sulfoxide source solution and pure water, a solution of N-methylpyrrolidone source solution and pure water, a solution of alkanolamine, glycolether and pure water or the like is used in a spray method or a dip method.

In the conventional method, starting by filling a resist stripping processing tank with the specified volume of a fresh resist stripping solution at the specified concentration, when the resist stripping solution is consumed and reaches a specified deterioration concentration region, on the basis of an empirical index such as the number of boards processed, the entire volume is exchanged with a prepared fresh solution in the batch operation system. This solution exchanging frequency varies with the tank volume, the type of boards and number of the boards, etc., but it is generally done about every four days.

When the resist stripping solution is deteriorated, the stripping speed is not constant, the remainder of the resist stripping is broken out, and decline in yield occurs. The amount of loss is significant when defectives occur in the resist stripping process which is the final stage in a photolithography process.

A resist stripping solution containing water is usually used in the temperature range of 30 to 60° C.

With regard to the boiling point of the components used for a resist stripping solution, organic alkali or organic solvent is about 160 to 250° C., and water is 100° C.

Accordingly, the water concentration is lowered as the water of a lower boiling point vaporizes preferentially with a purge nitrogen gas for air seal to the resist stripping solution tank during operation, and then the concentration variation of the resist stripping solution occurs. As a result, the resist stripping performance declines, but conventionally the water concentration was not measured in real time and not controlled at a specified concentration.

When the water concentration is further lowered, it may come to have a flash point, which leads to the risk of an explosion.

Besides, the resist dissolved in the resist stripping solution in the resist stripping process is gradually enriched, and it is a dominant cause of resist stripping performance deterioration such as a decline in stripping speed and occurrence of the remainder of the resist stripping, but conventionally the dissolved resist concentration was not measured in real time and not controlled at a specified concentration.

Therefore, in this period, the water concentration and the dissolved resist concentration vary with the passing of time and are not constant, and the remainder of the resist stripping is broken out. It was hence difficult to control the delicate dimensional precision in the liquid crystal boards, the product quality was unstable, and the yield was lowered.

Besides, due to stopping (down time) for exchanging solution, the operation rate was significantly lowered, and the exchange work of the resist stripping solution required extra labor cost.

OBJECT AND SUMMARY OF THE INVENTION

It is therefore a primary object of the present invention to solve the above-discussed problems of the prior art, while maintaining the advantages of the convenient line conveying system of the prior art which is suited to mass production in the liquid crystal board manufacturing process.

In other words, it is an object of the present invention to automatically control the resist stripping concentration to the specified water concentration and dissolved resist concentration upon preparing the source solution of the specified component ratio, to adequately control the solution replenishment in the resist stripping processing tank so as to always keep constant the resist stripping performance, to cut down the consumption of the source solution, to secure safety, to shorten the operation stopping time markedly, and to reduce the comprehensive manufacturing cost.

The present invention is intended to adjust and control the dissolved resist concentration by measuring absorbance, by experimentally confirming that the concentration of the resist dissolved in the resist stripping solution in the resist stripping processing tank is closely correlated with its absorbance (in a highly linear relation) as shown in FIG. 8, and to adjust and control the water concentration by measuring absorbance, by experimentally confirming that the water concentration in the resist stripping solution is closely correlated with its absorbance (in a highly linear relation) as shown in FIG. 5, thereby controlling both the water concentration and the resist concentration.

To achieve the above objects, the present invention provides an apparatus for controlling a resist stripping solution, which comprises liquid level adjusting and replenishing means for supplying a resist stripping source solution and pure water to keep constant the liquid level, and replenishing means for replenishing at least one of the resist stripping source solution and pure water by detecting the water concentration of the resist stripping solution in the resist stripping processing tank by means of an absorption photometer.

In the apparatus for controlling a resist stripping solution according to the present invention, the replenishing means, instead of replenishing the resist stripping source solution and pure water, replenishes a fresh resist stripping solution by preliminarily blending the resist stripping source solution and pure water.

That is, the apparatus for controlling a resist stripping solution according to the present invention comprises liquid level adjusting and replenishing means for supplying a resist stripping source solution and pure water to keep constant the liquid level, and fresh solution replenishing means for replenishing a fresh resist stripping solution by preliminarily blending the resist stripping source solution and pure water by detecting the water concentration of the resist stripping solution in the resist stripping processing tank by means of an absorption photometer.

Moreover, the present invention provides an apparatus for controlling a resist stripping solution, which comprises resist stripping solution discharge means for discharging the resist stripping solution by detecting the dissolved resist concentration in the resist stripping solution by means of an absorption photometer, source solution and water replenishing means (first replenishing means) for replenishing the resist stripping source solution and pure water by detecting the liquid level of the resist stripping solution by a liquid level gauge, and source solution and/or water replenishing means (second replenishing means) for replenishing at least one of the resist stripping source solution and pure water by detecting the water concentration of the resist stripping solution by means of an another absorption photometer (see FIG. 1).

In the apparatus for controlling a resist stripping solution according to the present invention, the first replenishing means, instead of replenishing the resist stripping source solution and pure water, replenishes a fresh resist stripping solution by preliminarily blending the resist stripping source solution and pure water (see FIG. 2).

That is, the apparatus for controlling a resist stripping solution according to the present invention comprises resist stripping solution discharge means for discharging the resist stripping solution by detecting the dissolved resist concentration in the resist stripping solution by means of an absorption photometer, fresh solution replenishing means for replenishing a fresh resist stripping solution by preliminarily blending the resist stripping source solution and pure water by detecting the liquid level of the resist stripping solution by a liquid level gauge, and source solution and/or water replenishing means for replenishing at least one of the resist stripping source solution and pure water by detecting the water concentration of the resist stripping solution by means of an another absorption photometer.

Furthermore, the present invention provides an apparatus for controlling a resist stripping solution, which comprises source solution and water replenishing means (third replenishing means) for replenishing the resist stripping source solution and pure water by detecting the dissolved resist concentration in the resist stripping solution by an absorption photometer, and source solution and/or water replenishing means (second replenishing means) for replenishing at least one of the resist stripping source solution and pure water by detecting the water concentration of the resist stripping solution by means of an another absorption photometer (see FIG. 3).

In the apparatus for controlling a resist stripping solution according to the present invention, the third replenishing means for replenishing the resist stripping source solution and pure water, instead of replenishing the resist stripping source solution and pure water, replenishes a fresh resist stripping solution by preliminarily blending the resist stripping source solution and pure water (see FIG. 4).

That is, the apparatus for controlling a resist stripping solution according to the present invention comprises fresh solution replenishing means for replenishing a fresh resist stripping solution by preliminarily blending the resist stripping source solution and pure water by detecting the dissolved resist concentration in the resist stripping solution by an absorption photometer, and source solution and/or water replenishing means (second replenishing means) for replenishing at least one of the resist stripping source solution and pure water by detecting the water concentration of the resist stripping solution by means of an another absorption photometer.

Examples to be used as the resist stripping source solution include, among others, dimethyl-sulfoxide source solution, N-methylpyrrolidone source solution, and blending source solution of alkanolamine and glycolether solvent.

Examples of alkanolamine to be used include, among others, monoethanolamine, diethanolamine, triethanolamine, N,N-dimethylethanolamine, N,N-diethylethanolamine, aminoethylethanolamine, N-methyl-N,N-diethanolamine, N,N-dibutylethanolamine, N-methylethanolamine, and 3-amino-1-propanol.

Examples of glycolether solvent to be used include, among others, butyldiglycol, diethyleneglycolmonomethylether, diethyleneglycolmonoethelether, and diethyleneglycolmonopropylether.

DETAILED DESCRIPTION OF THE PREFERRED EMBODIMENTS

Figure 1:
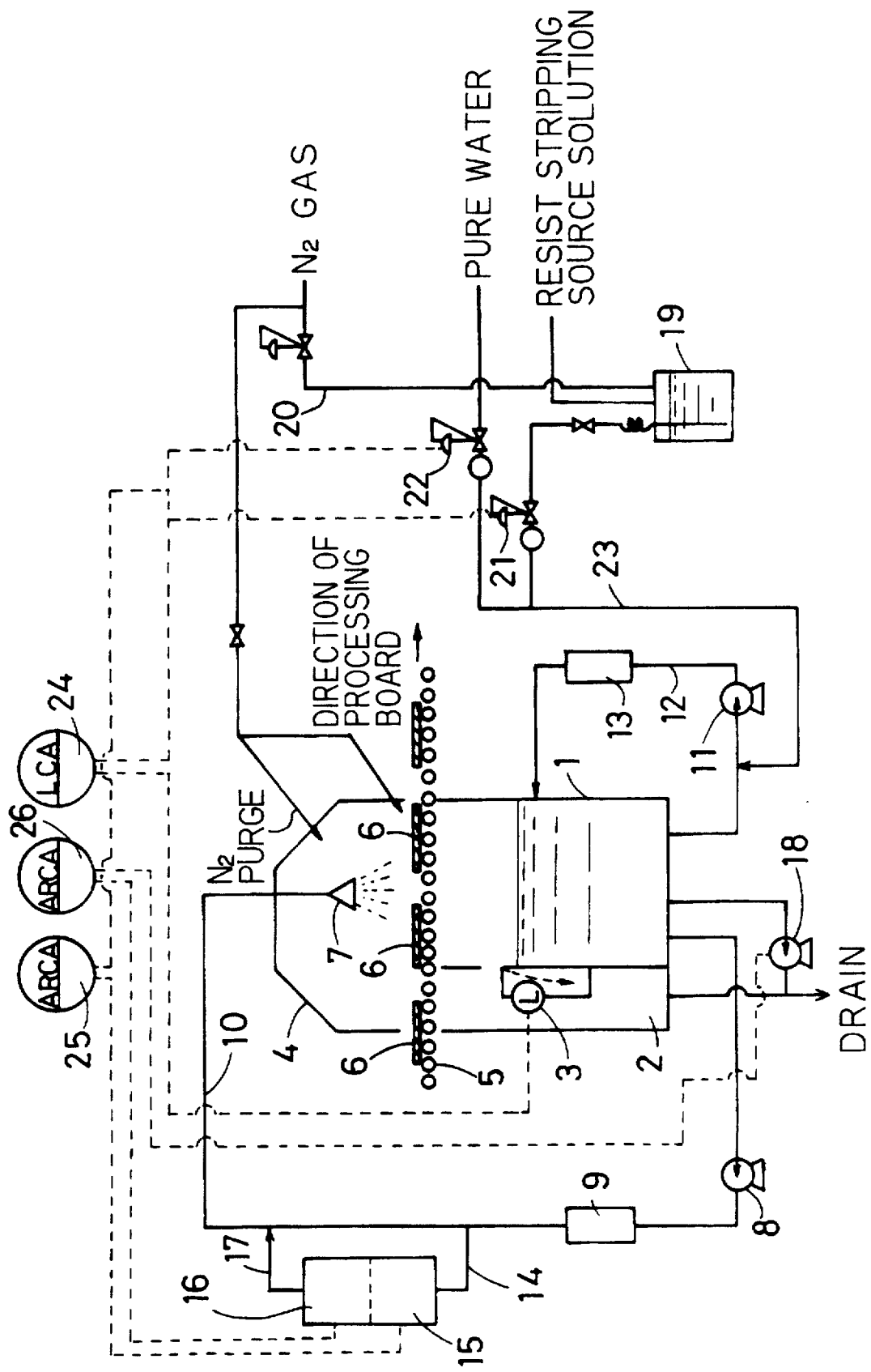
FIG. 1 is a schematic diagram of an apparatus for controlling the resist stripping solution according to a first embodiment of the present invention.

Referring now to the drawings, some of the preferred embodiments of the present invention are described in detail below. It must be noted, however, that the shape of constituent components and their configuration mentioned in the embodiments are not intended to limit the scope of the present invention, unless specifically described, but are only explanatory examples.

FIG. 1 is a schematic diagram showing an apparatus for controlling the resist stripping solution according to a first embodiment of the present invention. Reference numerals 1 to 13 in the diagram are components constituting a conventional existing resist stripping processing apparatus. That is, this conventional resist stripping processing apparatus comprises a resist processing tank 1 for storing the resist stripping solution, an overflow tank 2, a liquid level gauge 3, a resist stripping compartment hood 4, a resist stripping solution spray 7, a liquid feed pump 8 for feeding the solution to the resist stripping solution spray, a filter 9 for removing fine particles from the resist stripping solution, roller conveyors 5 for moving boards 6 during resist stripping, a circulation pump 11 for clarifying and agitating the resist stripping solution, a filter 13 for removing fine particles, and pipe for N2 gas, pure water, etc.

According to the present invention, the devices attached to the resist stripping processing apparatus include absorption photometers 15 and 16, a liquid discharge pump 18, a resist stripping source solution feed tank 19, a flow rate regulating valve 21 for feeding the resist stripping source solution, a flow rate regulating valve 22 for feeding pure water, piping for connecting these devices, and electrical instrumentation or pneumatic instrumentation.

The liquid volume stored in the resist stripping processing tank 1 is sufficient enough to feed the required volume for the resist stripping solution spray 7, but it must be controlled for stability of the process. The liquid level gauge 3 detects the liquid level drop due to a spontaneous decrease as the solution adheres to the boards and is brought outside during the resist stripping process, or detects the liquid level drop when the solution deteriorating in resist stripping performance is discharged by force. It controls the liquid volume in the resist stripping processing tank 1 in a specific range. Here, the old resist stripping solution is passed into the drain pipe by operating the discharge pump 18, or the old solution may be directly discharged out of the system without passing through the drain pipe.

The resist stripping source solution feed tank 19 for storing the resist stripping source solution, for example, a blending solution of monoethanolamine (hereinafter MEA) and butyldiglycol (hereinafter BDG) at a specific concentration is pressurized in the range of 1 to 2 $kgf/cm^2$ by N2 gas from the pipe 20, and the solution is fed under pressure as the flow rate regulating valve 21 for the resist stripping source solution opens. The pure water is supplied from the existing pipe to a branch pipe, and is fed as the flow rate regulating valve 22 for pure water opens. The resist stripping source solution and pure water are fed as the individual valves are regulated automatically, and are joined at the duct 23, led to the duct 12, and entered into the resist stripping processing tank 1 and mixed with the circulation flow.

It is also possible to supply the resist stripping source solution and pure water directly into the duct 12 or resist stripping processing tank 1 without them being joined on the way.

A sample solution is fed from the duct 14 into the absorption photometer 15 and the absorption photometer 16 (for example, the two instruments are combined in one body) installed online in the duct 10 for the resist stripping solution spray, and both of the absorbances are measured continuously, and the measured solution is returned to the duct 10 through the duct 17.

It is also possible to install the absorption photometer 15 and absorption photometer 16 separately, or to feed the sample solution into the absorption photometer 15 and absorption photometer 16 by using a circulation pump for measurement.

Figure 2:
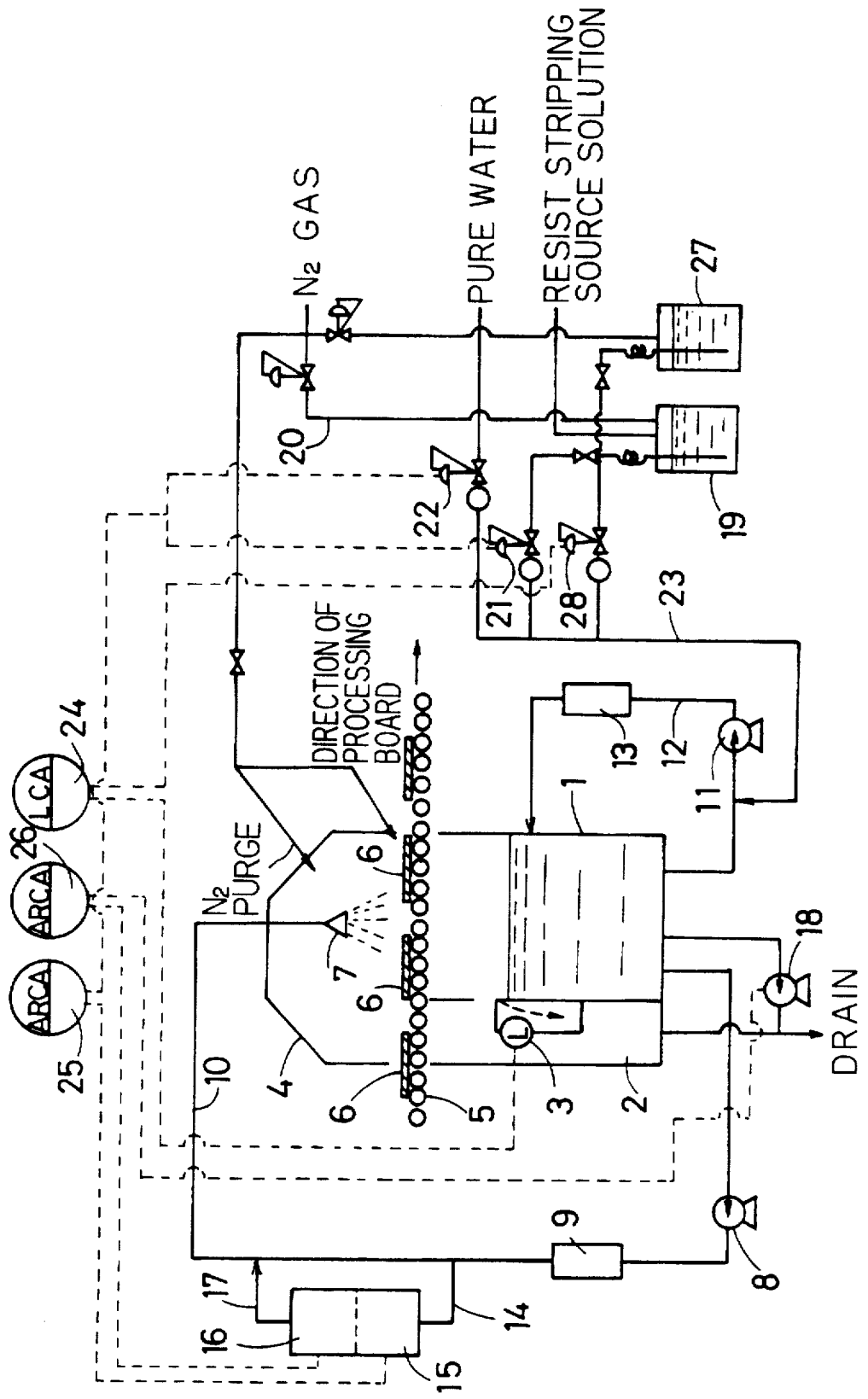
FIG. 2 is a schematic diagram of an apparatus for controlling the resist stripping solution according to a second embodiment of the present invention.

FIG. 2 is a schematic diagram of an apparatus showing a second embodiment of the present invention. In this embodiment, instead of replenishing the resist stripping source solution and pure water by detecting the liquid level of the resist stripping solution by the liquid level gauge 3, as shown in FIG. 2, the liquid level of the resist stripping solution is detected by the liquid level gauge 3, and a fresh resist stripping solution preliminarily blending the resist stripping source solution and pure water is replenished. A feed tank 27 is provided for fresh resist stripping solution, and a valve 28 is for regulating the fresh solution flow rate. The other construction is the same as that of FIG. 1.

Figure 3:
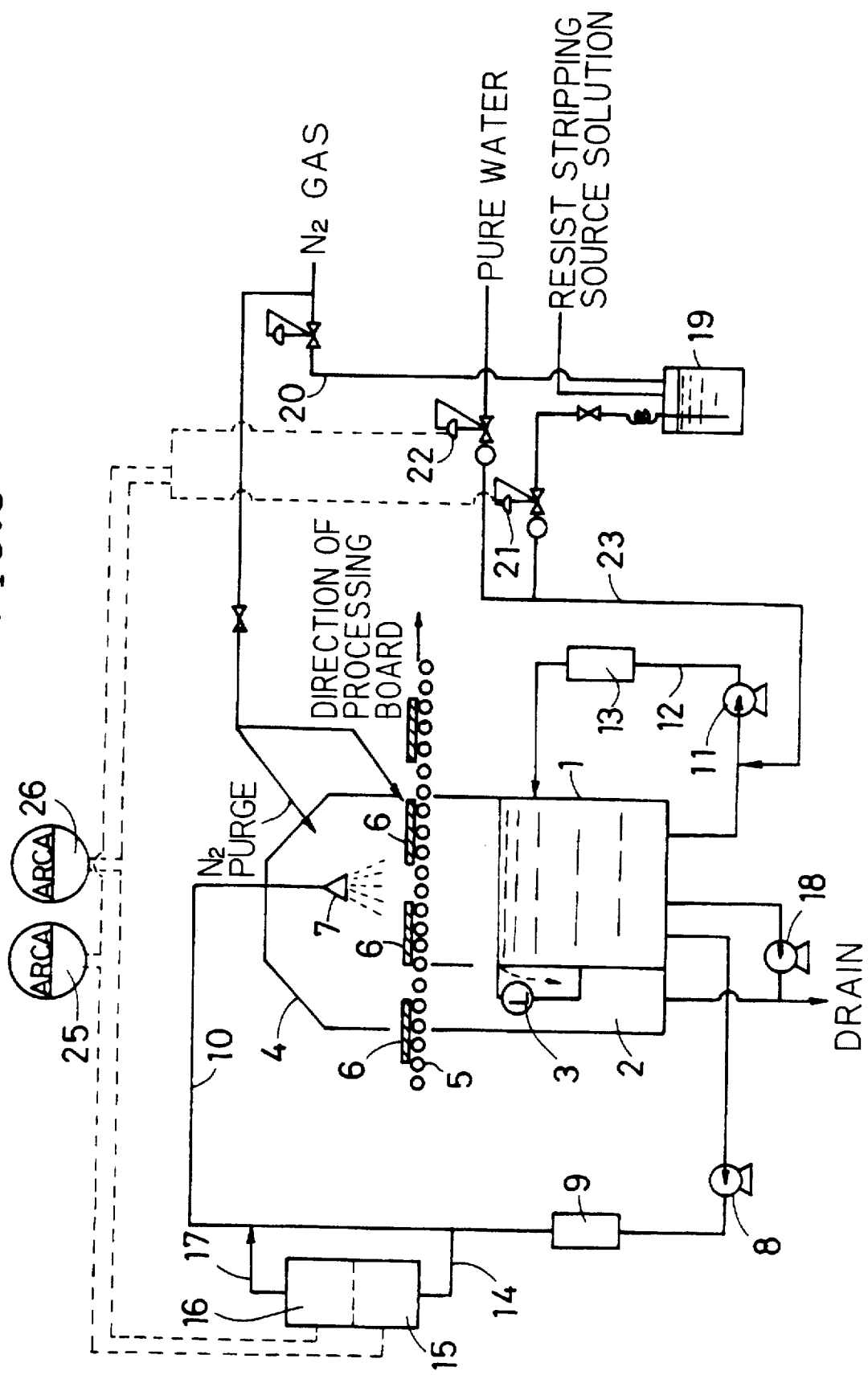
FIG. 3 is a schematic diagram of an apparatus for controlling the resist stripping solution according to a third embodiment of the present invention.

FIG. 3 is a schematic diagram of an apparatus showing a third embodiment of the present invention. This embodiment is composed so as to detect the dissolved resist concentration in the resist stripping solution by the absorption photometer 16, and replenish the resist stripping source solution and pure water. As shown in FIG. 3, usually, the liquid level is near the weir for overflow, and when at least one of the resist stripping source solution and pure water is replenished, the old resist stripping solution overflows from the overflow weir, and is discharged automatically. The discharge pump 18 is not necessarily required, and a valve may be disposed in place of the discharge pump 18. The other construction is the same as that of FIG. 1.

Figure 4:
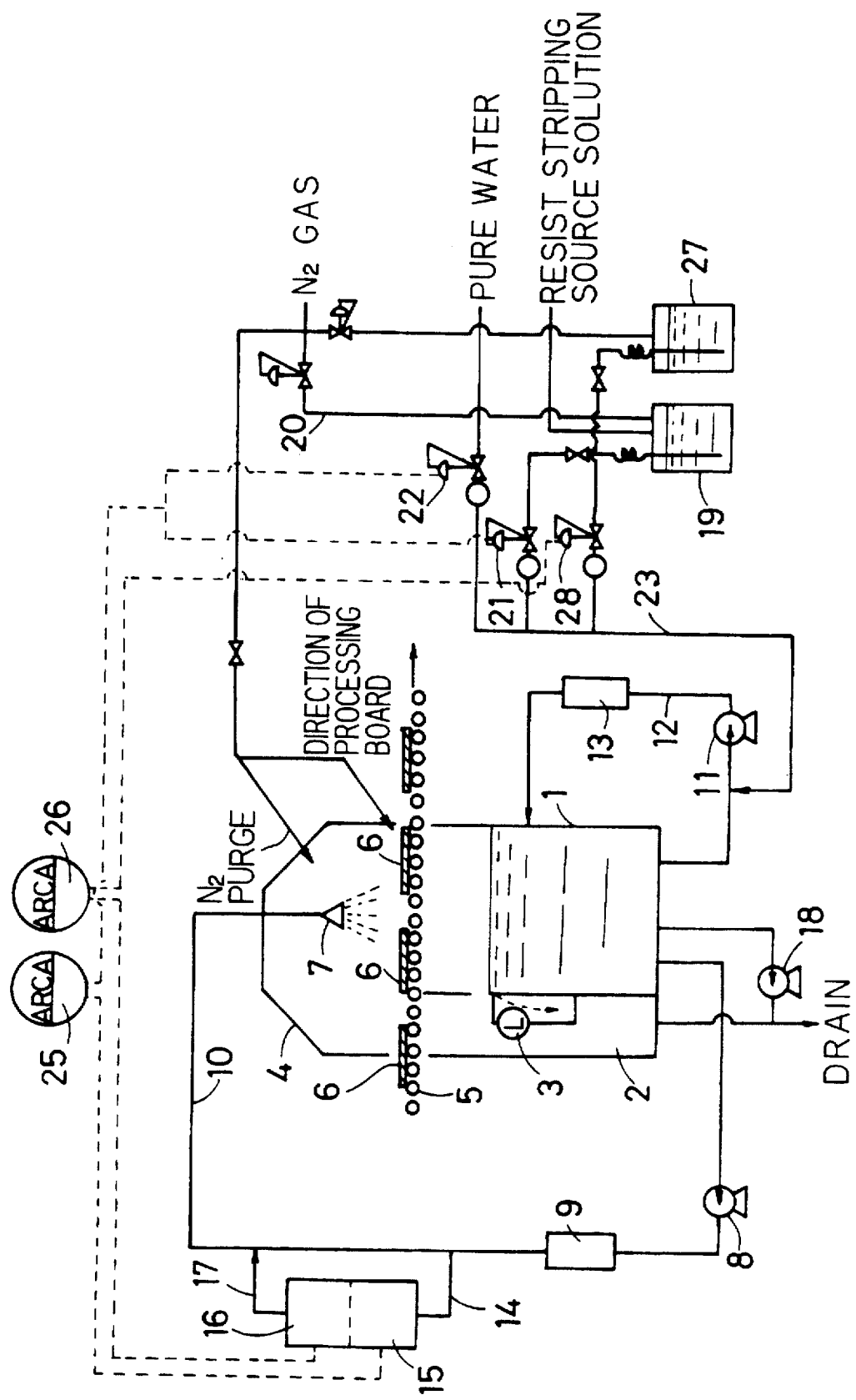
FIG. 4 is a schematic diagram of an apparatus for controlling the resist stripping solution according to a fourth embodiment of the present invention.

FIG. 4 is a schematic diagram of an apparatus showing a fourth embodiment of the present invention. This embodiment is designed to replenish a fresh resist stripping solution preliminarily blending the resist stripping source solution and pure water, instead of replenishing the resist stripping source solution and pure water in the third replenishing means for replenishing by detecting the dissolved resist concentration in the resist stripping solution by the absorption photometer 16. The other construction is the same as that of FIG. 1 and FIG. 3.

The control system of the apparatus in the embodiment shown in FIG. 1 is now explained.

The liquid level gauge 3 and the liquid level in the resist stripping processing tank 1, the absorption photometer 15 and the water concentration of the resist stripping solution, and the absorption photometer 16 and the dissolved resist concentration in the resist stripping solution function mutually independently in nature, but it is characteristic of the present invention to operate them in a mutually complementary relation.

In the first place, the target value of the water concentration in the resist stripping solution, the enrichment limit value of the dissolved resist concentration, and others necessary for quality control of the product boards must be preset in the controllers on the basis of experience or calculation.

The following is explained for an embodiment of using the resist stripping solution blending an MEA, a BDG, and pure water.

Usually, the water concentration of the resist stripping solution, which is maintained at the constant temperature of about 40° C., is decreased as the water vaporizes preferentially with purge nitrogen gas, while the number of boards processed increases, and therefore the resist stripping performance of the resist stripping solution deteriorates gradually.

Accordingly, the water concentration must be controlled at a specified target value, for example, 29.0±1.0%. Conventionally, empirically, the degree of deterioration of the resist stripping solution was judged by the correlation with the number of boards processed, the chemical analysis or the like, but a prompt and accurate grasp of the deterioration was difficult.

According to the present invention, the relation between the water concentration and the absorbance of the resist stripping solution was experimentally studied, and it was learned that the measuring frequency of the absorbance was appropriately in a range of near infrared ray region of 950 nm to 1010 nm, and the sensitivity was large near 976 nm and it was particularly favorable.

The measuring wavelength is selected from the near infrared ray region, and is employed depending on the type and concentration of the stripping solution and resist.

Figure 5:
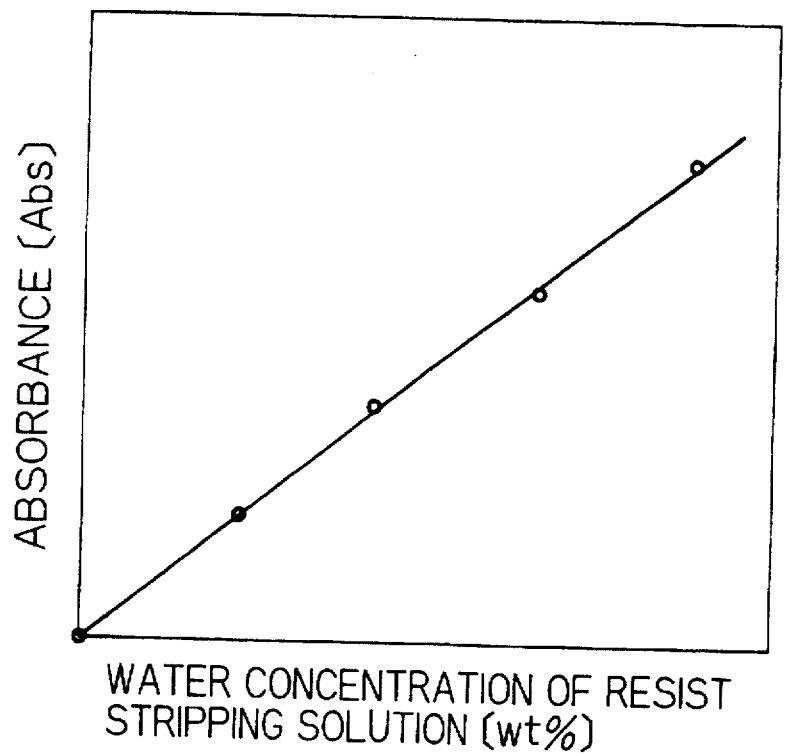
FIG. 5 is a graph showing the relation between the water concentration and absorbance in the resist stripping solution relating to the present invention.

As shown in FIG. 5, the relation between the absorbance and water concentration of the resist stripping solution at the measuring wavelength of $\lambda=976$ nm is in an advanced linear relation, and it was confirmed that the water concentration could be measured accurately by detecting the absorbance.

The absorption photometer 15 installed online in the duct 10 has compensating functions to minimize the measuring error and an absorbance controller 25. The absorbance measurement value of the sample solution led in from the duct 10 is fed into the absorbance controller 25, and at least one of the resist stripping source solution and pure water is automatically controlled by the flow rate regulating valves 21, 22 on the basis of the output signal from the absorbance controller 25 so as to coincide with the target value, and replenished until the water concentration is adjusted to the target value.

Figure 6:
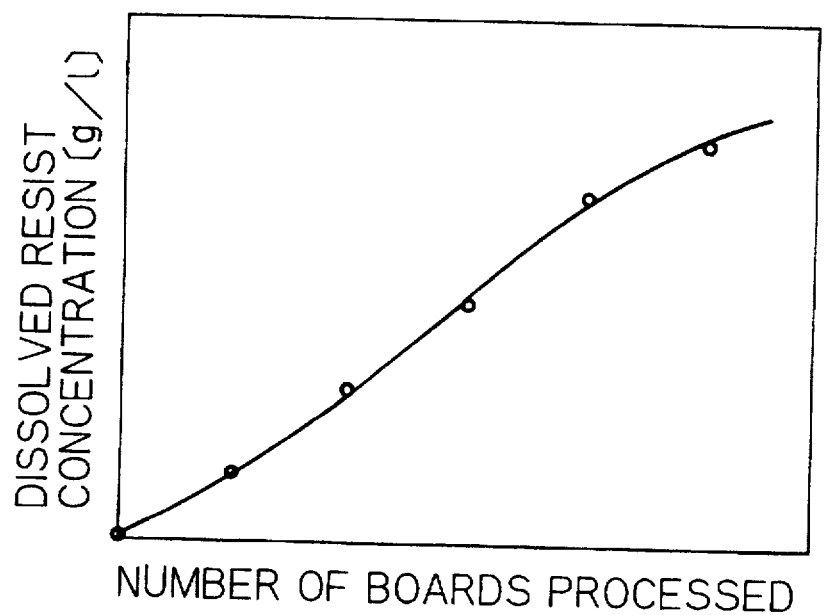
FIG. 6 is a graph of an operation example showing the relation between the number of resist stripping processing boards and the dissolved resist concentration.

Deterioration of resist stripping performance is also related with the dissolved resist concentration, aside from the water concentration. The resist stripping solution for board processing is taken out from the resist stripping processing tank 1 by the liquid feed pump 8, and is circulated through the resist stripping solution spray 7, and therefore the dissolved substance is gradually concentrated in the resist stripping solution. The main dissolved substance is resist. As shown in and operation example in FIG. 6, the dissolved resist is concentrated according as the number of board processed increases, and consequently the resist stripping performance deteriorates significantly. Hitherto, the concentration change was not measured in real time to control the resist stripping performance at a specific value.

That is, the index of deterioration was the number of boards processed, but since the board shape, the resist coating thickness and the resist stripping pattern are not constant, and the dissolved resist amount varies in each type of board, it is difficult to judge by the number of boards processed.

Figure 7:
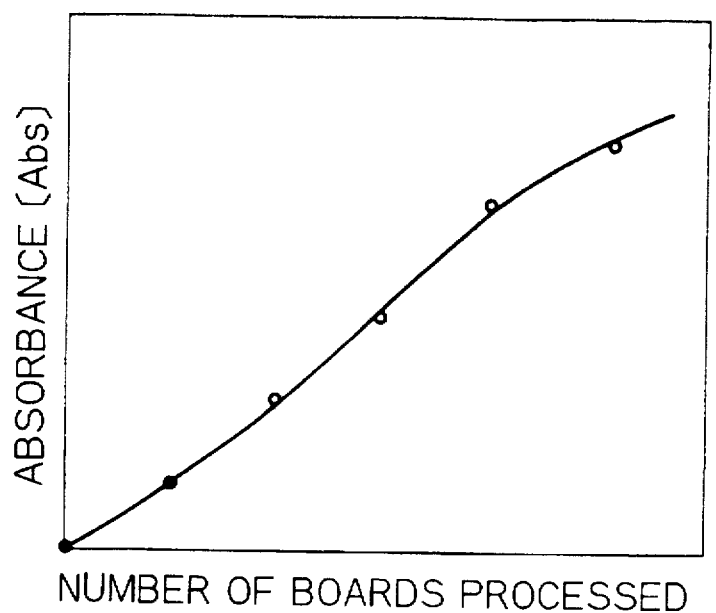
FIG. 7 is a graph showing the relation between the number of resist stripping processing boards and the absorbance for measurement of dissolved resist concentration relating to the present invention.
Figure 8:
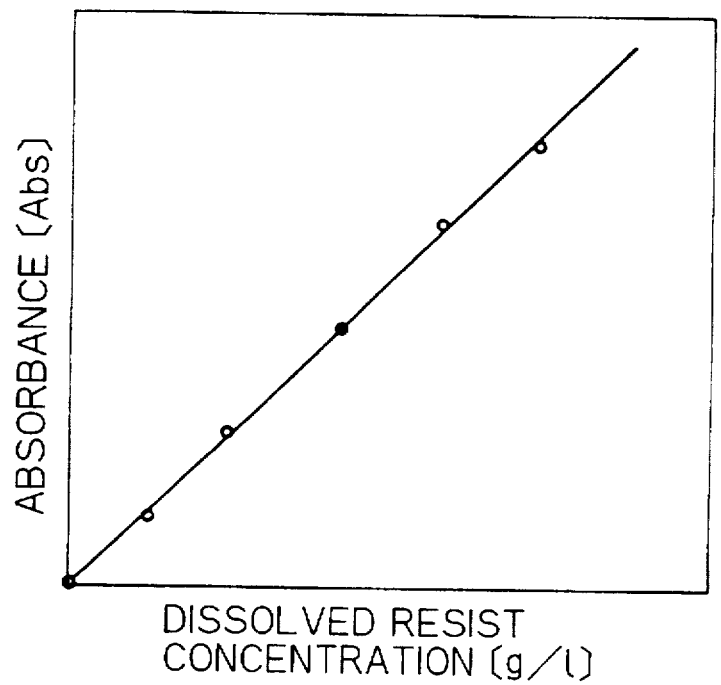
FIG. 8 is a graph showing the relation between the dissolved resist concentration and the absorbance in the resist stripping solution relating to the present invention.

Attempts to measure it in relation with the absorbance from the studies on the concentrated resist contamination state of the resist stripping solution were made, and the result as shown in FIG. 7 and FIG. 8 by experiment were obtained. As shown in FIG. 8, the dissolved resist concentration and the absorbance are in an advanced linear relation regardless of the water concentration and the like, and it is possible to judge the limit of the resist stripping performance by the dissolved resist concentration itself regardless of the number of boards processed. An appropriate measuring wavelength for the dissolved resist concentration was $\lambda=560$ nm. Meanwhile, the measuring wavelength is selected from a range of the visible ray region of 400 nm to a near infrared ray region of 800 nm, and is employed depending on the kind and concentration of the resist.

The absorption photometer 16 installed in the duct 10 in one body with or separately from the absorption photometer 15 continuously measures the dissolved resist concentration in the resist stripping solution, and when the value exceeding the deterioration limit is detected, the discharge pump 18 is put in operation by the output signal from the absorbance controller 26, the deteriorating resist stripping solution is drawn out from the resist stripping processing tank 1, and is discharged into the drain pipe, or directly discarded out of the system. As a result, the resist stripping processing in tank 1 is lowered in level, the liquid level gauge 3 immediately detects the lowered liquid level, and a fresh resist stripping solution is replenished, and the dissolved resist concentration is diluted to the deterioration limit value, so that the resist stripping performance is recovered, and the discharge pump 18 stops.

Here is stated the functional relation of the control system intended by the apparatus in the embodiment in FIG. 1.

When the resist stripping processing tank 1 is empty and building up a solution, the liquid level gauge 3 detects the empty level, and by the output signal from the liquid level controller 24, the resist stripping source solution and pure water are supplied, at a proper flow rate ratio, by regulating the valve opening degree by means of the flow rate regulating valves 21, 22.

In succession, the absorption photometer 15 continuously measures the absorbance of the built-up resist stripping solution, and by the output signal from the absorbance controller 25, at least one of the resist stripping source solution and pure water is supplied, at a proper small flow rate, by regulating the valve opening degree of at least one of the flow rate regulating valves 21 and 22 so as to be controlled automatically to achieve the water concentration of the target value.

Next, when a resist stripping process is started, lowering of the water concentration, drop of liquid level due to carry-over by the boards, and enrichment of the dissolved resist are progressed.

When the water concentration is lowered, the absorbance of the resist stripping solution is continuously measured by the absorption photometer 15, and by the output signal of the absorbance controller 25, pure water is supplied at a proper small flow rate by regulating the valve opening degree by the flow rate regulating valve 22 so as to be controlled automatically to maintain the water concentration of the target value.

When the level of the solution being brought out by the boards drops, the liquid level gauge 3 detects the lowered liquid level, and by the output signal of the liquid level controller 24, the resist stripping source solution and pure water are supplied at a proper flow rate ratio by regulating the valve opening degree by means of the flow rate regulating valves 21, 22.

When the dissolved resist is concentrated to reach the deterioration limit, the absorption photometer 16 detects the value exceeding the deterioration limit by continuously measuring the dissolved resist concentration of the resist stripping solution, and by the output signal of the absorbance controller 26, the discharge pump 18 is put in action, and the deteriorating resist stripping solution is drawn out from the resist stripping processing tank 1, and discarded into the drain pipe, or discarded directly out of the system.

As a result, the liquid level drops, and the liquid level gauge 3 detects the lowered liquid level, and by the output signal of the liquid level controller 24, the resist stripping source solution and pure water are supplied at a proper flow rate ratio by regulating the valve opening degree by the flow rate regulating valves 21, 22. Since a fresh resist stripping solution is replenished in the resist stripping processing tank 1, the resist stripping performance is recovered as the dissolved resist concentration is diluted to the deterioration limit, and the discharge pump 18 stops.

Above the liquid level gauge 3, an overflow weir is disposed at a position which usually does not allow overflow, but a slight overflow does not matter.

Next is described the functional relation of the control system intended by the apparatus of the third embodiment shown in FIG. 3.

When the resist stripping processing tank 1 is empty and building up a solution, by manual operation, the resist stripping source solution and pure water are supplied at a proper flow rate ratio by regulating the valve opening degree of the flow rate regulating valves 21, 22.

Successively, the absorption photometer 15 continuously measures the absorbance of the built-up stripping solution, and by the output signal of the absorbance controller 25, at least one of the resist stripping source solution and pure water is supplied at a proper small flow rate by regulating the valve opening degree by at least one of the flow rate regulating valves 21 and 22 so as to be controlled automatically to reach the target value of water concentration.

Next, when resist stripping process begins, lowering of the water concentration, drop in the liquid level as brought out by boards, and enrichment of dissolved resist are advanced.

In the case of lowering of the water concentration, the absorption photometer 15 continuously measures the absorbance of the resist stripping solution, and by the output signal of the absorbance controller 25, the pure water is supplied at a proper small flow rate by regulating the valve opening degree of the flow rate regulating valve 22 so as to be controlled automatically to reach the target value of water concentration.

When the liquid level drops as being brought out by the boards, the liquid level is slightly lower than the weir position for overflow.

When the dissolved resist is enriched to reach the deterioration limit, the absorption photometer 16 continuously measures the dissolved resist concentration in the resist stripping solution, and when any value exceeding the deterioration limit is detected, by the output signal of the absorbance controller 26, the resist stripping source solution and pure water are supplied at a proper flow rate ratio by regulating the valve opening degree of the flow rate regulating valves 21, 22.

Since a fresh resist stripping solution is replenished, the dissolved resist concentration is diluted to the deterioration limit value, so that the resist stripping performance is recovered.

The liquid level is near the weir position for overflow, and when the resist stripping source solution or pure water is replenished, the deteriorating resist stripping solution overflows from the overflow weir.

By applying the result on the basis of the control functions in mutually complementary relations as described above, it has been found by experiment that the recovery of resist stripping performance, continuous operation, and saving of consumption of resist stripping solution can be realized easily and comprehensively.

Figure 9:
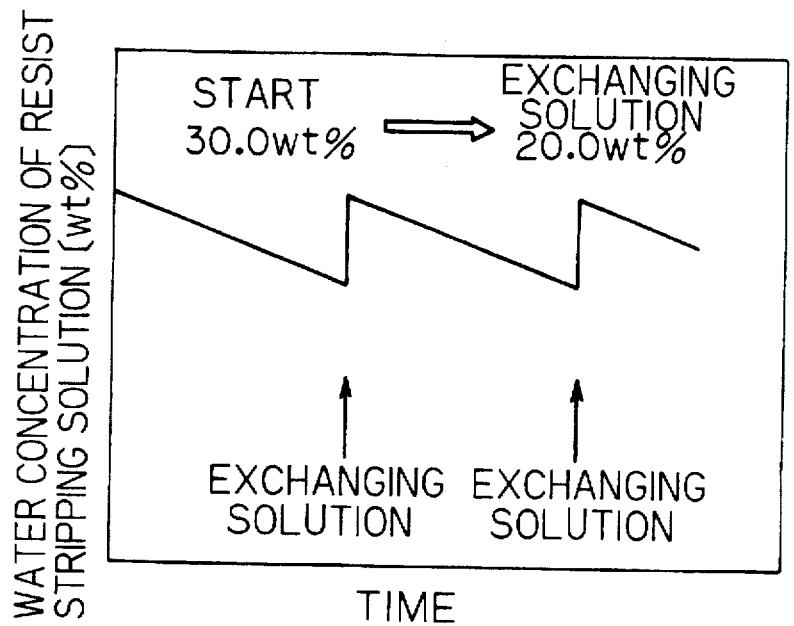
FIG. 9 is a graph showing the relation between the water concentration of the resist stripping solution and the operation time in the conventional method.

Next, for conceptual understanding, the operation pattern effects are compared between the present invention and the prior art in FIGS. 9 to 12. In the prior art, as shown in FIG. 9, the starting water concentration was, for example, 30.0 wt. %, and the solution was exchanged when the concentration was lowered to, for example, 20.0 wt. % (chemical analysis value) in the course of time. In this case, the water concentration transition is in a sawtooth profile, and due to variation width of the water concentration, the resist stripping performance was not constant.

Figure 10:
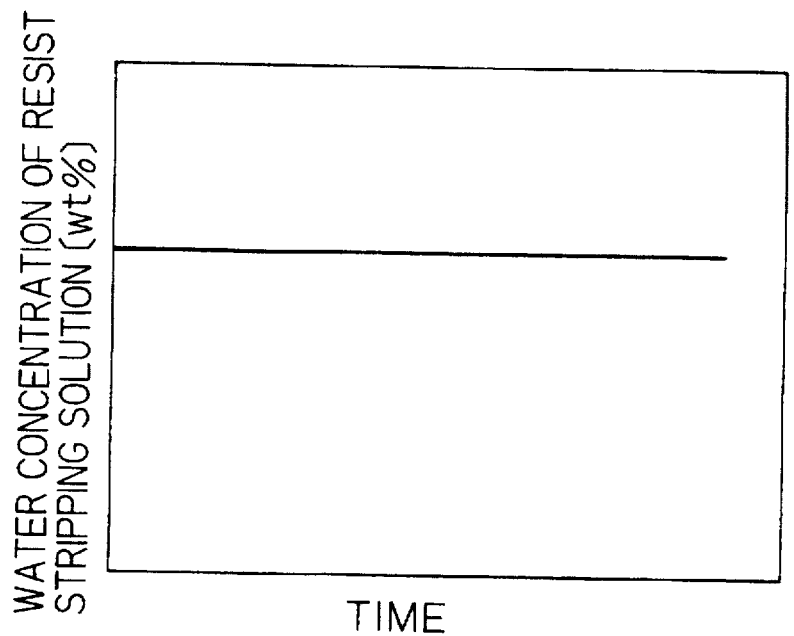
FIG. 10 is a graph showing the relation between the water concentration of the resist stripping solution and the operation time when the apparatus of the present invention is used.

By the apparatus of the present invention, on the other hand, as shown in FIG. 10, the water concentration remains constant at, for example, 29.0±1.0 wt. % in the course of time, and the resist stripping performance is constant, and it is not necessary to exchange the solution.

Figure 11:
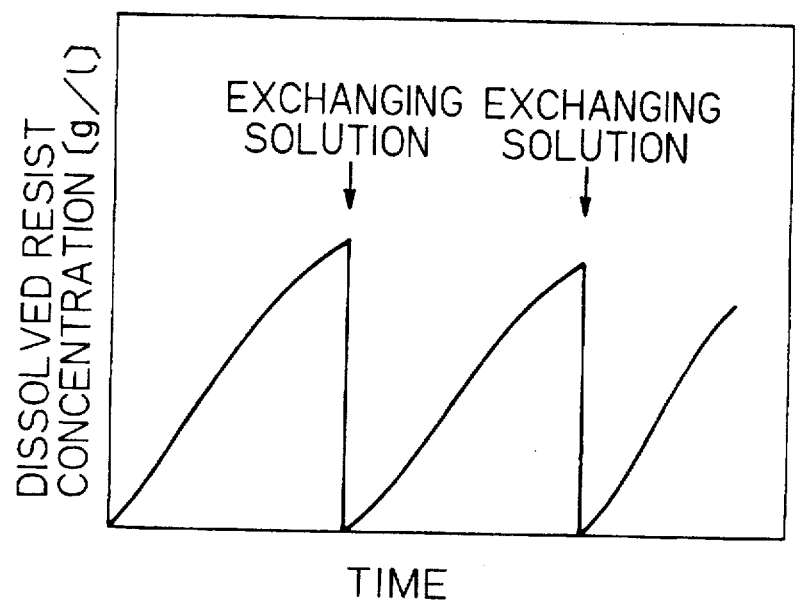
FIG. 11 is graph showing the relation between the dissolved resist concentration and the operation time in the conventional method.

In the prior art, moreover, as shown in FIG. 11, the starting dissolved resist concentration increased as time passed, and the solution was exchanged when the concentration reached a region of the resist stripping performance deterioration. In this case, as shown in FIG. 11, the time course change of the dissolved resist concentration is in a sawtooth profile, and a variation width occurred in the dissolved resist concentration. Hence the resist stripping performance was not stable.

Figure 12:
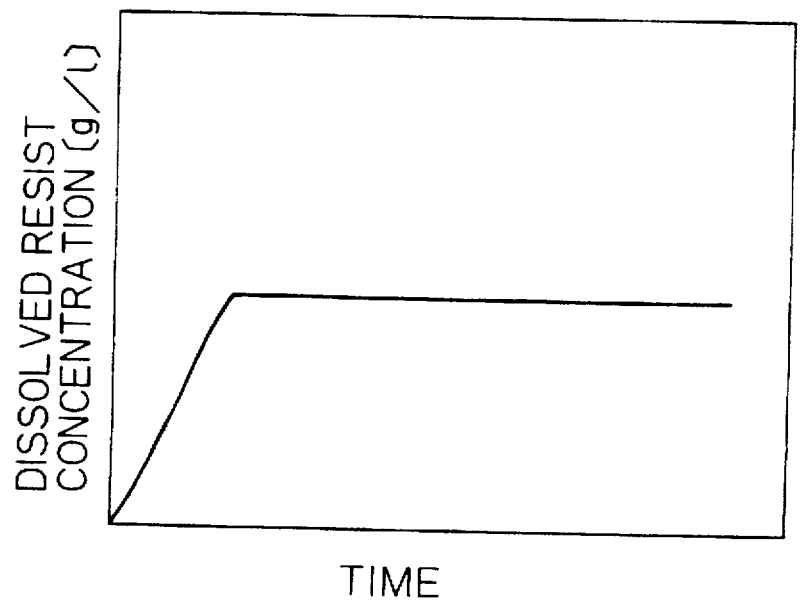
FIG. 12 is a graph showing the relation between the dissolved resist concentration and the operation time when the apparatus of the present invention is used.

According to the apparatus of the present invention, by contrast, the dissolved resist concentration remains constant after a certain time lapse as shown in FIG. 12, and the resist stripping performance is stable, is that it is not necessary to exchange the solution.

As mentioned above, the present invention can be applied not only in the case where blending solution of MEA, BDG and pure water is used as the resist stripping solution, but also in the case where the blending solution of organic alkali and pure water, organic solvent and pure water, organic alkali, organic solvent and pure water, or organic alkali, organic solvent, pure water and additive is used as the resist stripping solution.

The addition to the spray method described in the foregoing embodiments, the dip method and spin method may be similarly employed. It is also possible to install a plurality of resist stripping processing tanks, and combine with a reservoir tank or the above control means.

Thus, having such construction, the present invention brings about the following effects.

(1) By applying the present invention in the resist stripping process of semiconductor or liquid crystal boards, the water concentration and dissolved resist concentration in the resist stripping solution can be monitored continuously in real time, so as to be controlled to the specified concentration at a high precision.

Accordingly, the resist stripping performance of the boards is stable, and product yield is enhanced substantially.

Besides, since the water concentration is controlled to a specified value, while maintaining safety the resist stripping solution does not have a flash point, and continuous operation for a long period is enabled at a stable liquid level.

(2) By using an inexpensive resist stripping solution and constantly controlling its quality, continuous operation is enabled, down time of solution exchange and wasteful disposal are eliminated, while the solution consumption and stripping solution cost are saved substantially, productivity is greatly enhanced owing to an increase in the operation rate, and labor cost is reduced by unmanned operation. Many other comprehensive effects are expected.

(3) When using a resist stripping solution blending a conventional organic alkali and an organic solvent, a board processing temperature of about 80° C. was needed, but in the apparatus of the present invention, since an appropriate amount of water is contained in the resist stripping solution, the board processing temperature can be lowered to about 40° C. Hence, damage to the foundation metal for forming the board or semiconductor circuit can be reduced, and the resist stripping solution containing water can be handled as a nonflammable matter. Safety is high, the evaporation loss is mostly water which is inexpensive, the stripping speed is fast, and many other excellent effects are brought about.

Having described preferred embodiments of the present invention with reference to the accompanying drawings, it is to be understood that the present invention is not limited to those precise embodiments, and that various changes and modifications may be effected therein by one skilled in the art without departing from the scope or spirit of the present invention as defined in the claims.

What is claimed is:

1. An apparatus for controlling a resist stripping solution, comprising: a liquid level gauge; an absorption photometer; a further absorption photometer; resist stripping solution discharge means for discharging the resist stripping solution by detecting the dissolved resist concentration in the resist stripping solution by means of said absorption photometer; source solution and water replenishing means for replenishing the resist stripping source solution and pure water by detecting the liquid level of the resist stripping solution by said liquid level gauge; and source solution and/or water replenishing means for replenishing at least one of the resist stripping source solution and pure water by detecting the water concentration of the resist stripping solution by means of said further absorption photometer.

2. An apparatus for controlling a resist stripping solution, comprising: a liquid level gauge; an absorption photometer; a further absorption photometer, resist stripping solution discharge means for discharging the resist stripping solution by detecting the dissolved resist concentration in the resist stripping solution by means of said absorption photometer; fresh solution replenishing means for replenishing a fresh resist stripping solution by preliminarily blending the resist stripping source solution and pure water by detecting the liquid level of the resist stripping solution by said liquid level gauge; and source solution and/or water replenishing means for replenishing at least one of the resist stripping source solution and pure water by detecting the water concentration of the resist stripping solution by means of said further absorption photometer.

3. An apparatus for controlling a resist stripping solution, comprising: an absorption photometer, a further absorption photometer, source solution and water replenishing means for replenishing the resist stripping source solution and pure water by detecting the dissolved resist concentration in the resist stripping solution by said absorption photometer; and source solution and/or water replenishing means for replenishing at least one of the resist stripping source solution and pure water by detecting the water concentration of the resist stripping solution by means of said further absorption photometer.

4. An apparatus for controlling a resist stripping solution, comprising: an absorption photometer; a further absorption photometer; fresh solution replenishing means for replenishing a fresh resist stripping solution by preliminarily blending the resist stripping source solution and pure water by detecting the dissolved resist concentration in the resist stripping solution by said absorption photometer; and source solution and/or water replenishing means for replenishing at least one of the resist stripping source solution and pure water by detecting the water concentration of the resist stripping solution by means of said further absorption photometer.

* * * * *